United States Patent [19]
Huang et al.

[11] Patent Number: 5,776,813
[45] Date of Patent: Jul. 7, 1998

[54] PROCESS TO MANUFACTURE A VERTICAL GATE-ENHANCED BIPOLAR TRANSISTOR

[75] Inventors: Tzuen-Hsi Huang, Tou Liu; Chwan-Ying Lee, Tainan, both of Taiwan

[73] Assignee: Industrial Technology Research Institute, Hsinchu, Taiwan

[21] Appl. No.: 944,574

[22] Filed: Oct. 6, 1997

[51] Int. Cl.$^6$ ................................................. H01L 21/265
[52] U.S. Cl. .......................... 438/309; 438/133; 438/135; 438/137
[58] Field of Search ...................... 438/309, 322, 438/323, 325, 133, 134, 135, 136, 137, 138

[56] References Cited

U.S. PATENT DOCUMENTS

| | | | |
|---|---|---|---|
| 5,227,653 | 7/1993 | Sin | 257/334 |
| 5,304,821 | 4/1994 | Hagino et al. | 257/133 |
| 5,380,670 | 1/1995 | Hagino et al. | 438/138 |
| 5,397,912 | 3/1995 | Sundaram | 257/518 |
| 5,430,318 | 7/1995 | Hsu | 257/370 |
| 5,637,889 | 6/1997 | Groover et al. | 257/192 |

*Primary Examiner*—Charles L. Bowers, Jr.
*Assistant Examiner*—Craig Thompson
*Attorney, Agent, or Firm*—George O. Saile; Stephen B. Ackerman

[57] ABSTRACT

A process for manufacturing a vertical gate-enhanced bipolar transistor is described. The process does not require the presence of an insulating substrate to electrically isolate devices and is suitable for both NPN as well as PNP bipolar transistors. The process begins with the formation of a buried layer. This layer is accessed from the surface through a suitable well region. Then a trench, shaped as a hollow square is formed, lined with a layer of gate oxide and then filled with low resistivity polysilicon to form the gate. A polysilicon emitter layer is formed in the interior of the square, following implantation of arsenic ions with thermal drive-in to form an emitter junction just below the surface. After formation of the emitter junction, isolation layers, including self-aligned spacers, are constructed to cover the polysilicon emitter layer. Another layer of polysilicon is then laid down and then boron ions are implanted. This is followed by a thermal drive-in to form a base contact. The polysilicon is then patterned and etched to serve as the base electrode. A layer of oxide is laid down and flowed to provide planarization/insulation and contact holes are etched in it. Finally, a metallic layer is laid down and etched to form circuit wiring. With the help of the vertical polysilicon gate, emitter current injection is enhanced so that current gain is increased relative to a conventional bipolar device.

21 Claims, 6 Drawing Sheets

5,776,813

PROCESS TO MANUFACTURE A VERTICAL GATE-ENHANCED BIPOLAR TRANSISTOR

BACKGROUND OF THE INVENTION (1) Field of the Invention

The invention relates to the general field of bipolar transistors, more particularly to their manufacture.

(2) Description of the Prior Art

Methods for manufacturing bipolar transistors have been known and used for a number of years. Generally, the emitter and base regions are formed by successive diffusions of the appropriate dopants from a vapor phase source.

It is known that an increase in current gain may be achieved if a FET style gate is used to enhance operation of the device along one edge. This is most easily done in a lateral design wherein access to an edge (for the added gate to operate) is readily available. A lateral bipolar transistor of this type has been described by, for example, Sundaram (U.S. Pat. No. 5,397,912) in March 1995.

A lateral bipolar transistor design that incorporates a gain enhancing gate has been described by Sin (U.S. Pat. No. 5,227,653) in July 1993. Sin's device is of the SOI (silicon on insulator) type. It relies on a layer of insulation to provide electrical isolation between multiple devices in the same integrated circuit, this limitation being a consequence of the process that Sin used for the manufacture of his device. As will be seen below, this limitation is removed by use of the process that is taught in the present invention.

Another example of a lateral bipolar transistor may be found in Hsu (U.S. Pat. No. 5,430,318 July 1995). BICMOS manufacturing technology has been used here, too, but the MOS devices are formed on an insulating layer and no gate enhancement of the base is provided.

SUMMARY OF THE INVENTION

It has been an object of the present invention to provide a process for manufacturing a vertical gate-enhanced bipolar transistor.

A further object of the present invention has been that said process not require the inclusion of an insulating substrate for the purpose of electrically isolating individual devices.

Another object of the invention has been that the process lead to a device that has a significantly higher current gain than devices lacking edge enhancement.

A still further object of the invention has been that said process be fully compatible with existing processes for the formation of BICMOS devices.

These objects have been achieved in a process in which a buried layer is first formed. This layer is accessed from the surface through a suitable well region. Then a trench, shaped as a hollow square is formed, lined with a layer of gate oxide and then filled with low resistivity polysilicon to form the gate. A polysilicon layer is deposited and then implanted with arsenic ions. Next, this polysilicon layer is patterned to form a polysilicon emitter electrode in the interior of the square. At the same time, this polysilicon layer is also patterned over one side of the gate to serve as a contact buffer layer between the metal layer and the gate. A procedure for interlayer isolation is then implemented during which a high temperature oxidation step is required for oxide film growth as well as for emitter junction formation. After isolation, another layer of polysilicon is laid down and then boron ions are implanted into it. This is followed by a thermal drive-in to form a base contact. The polysilicon is then patterned and etched to provide suitable contact wiring. A layer of oxide is laid down and contact holes are etched in it. Finally, a metallic wiring layer is laid down and etched to form circuit wiring.

BRIEF DESCRIPTION OF THE DRAWINGS

FIGS. 6 and 7 show how the emitter and then the base regions are formed by successive ion implantation steps followed by thermal drive-in.

DESCRIPTION OF THE PREFERRED EMBODIMENTS

The process that we will describe below results in the formation of NPN bipolar transistors. It will, however, be understood by those skilled in the art that the process could equally well be used to manufacture a PNP bipolar transistor by appropriately reversing the conductivity types of the various layers that are formed during the process. The process described below is fully compatible with existing processes for manufacturing BICMOS devices.

Figure 1:
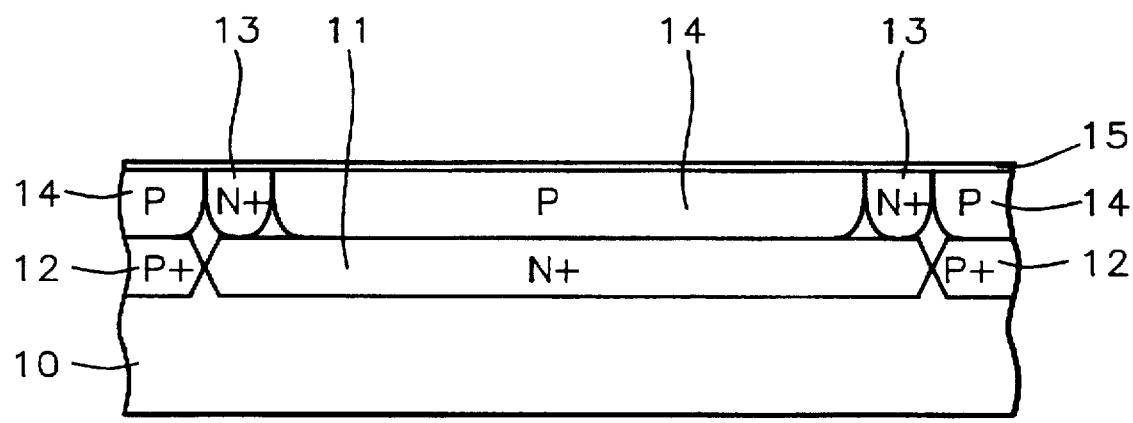
FIG. 1 shows the initial steps of the process, including the formation of a buried layer.

Referring now to FIG. 1, we show there the starting substrate 10 which is a body of N-type or P-type silicon, with P-type being preferred. The process then begins with the formation of N+ and P+ buried layers 11 and 12 respectively. These buried layers are formed through ion implantation (in combination with photoresist masking). Arsenic or antimony ions are used to form the N+ regions while boron ions are used for the P+ regions. Ion dosages and energies are chosen so that layers 11 and 12, at the conclusion of all processing, have a thickness between about 2 and 3.5 microns and a dopant concentration between about $1 \times 10^{19}$ and $6 \times 10^{19}$ donors/cm$^3$ and between about $4 \times 10^{17}$ and $2 \times 10^{18}$ acceptors/cm$^3$, corresponding to sheet resistances between about 15 and 25 ohms/square and between about 0.4 and 1.5 kilo-ohms/square for the N+ and P+ buried layers respectively.

Next, a layer of epitaxial silicon, between about 0.8 and 2 microns thick, is deposited on the upper surface, and N-type collector sink 13 and P well 14 are defined in the usual way by means of ion implantation followed by thermal drive-in. These extend downward from the upper surface and make contact with the buried layers 11 and 12. This is followed by the growth of silicon oxide layer 15 on the upper surface to a thickness between about 150 and 350 Angstroms. The structure at this stage has the appearance shown in FIG. 1.

Figure 2:
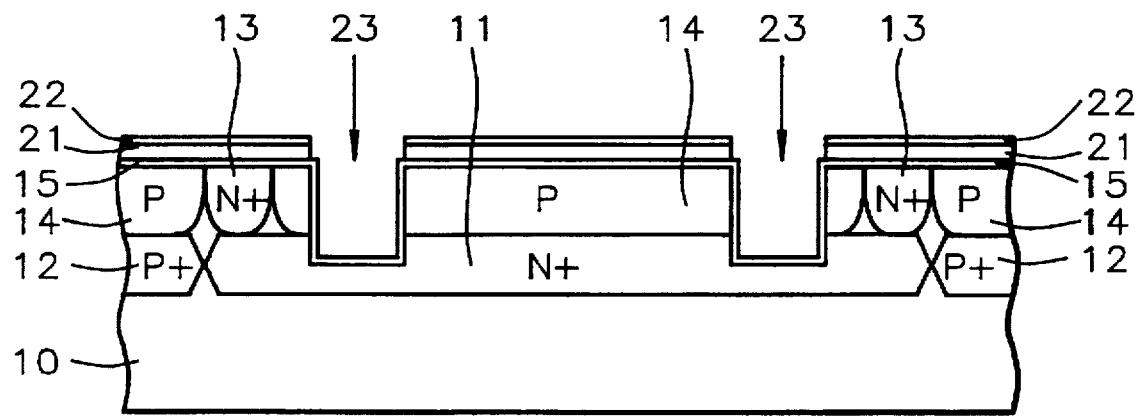
FIGS. 2 and 3 show how a trench is etched, lined with a layer of gate insulation, and then filled with polysilicon to form the edge gate.

Referring now to FIG. 2, silicon nitride layer 21 is deposited over silicon oxide layer 15 to a thickness between about 750 and 1,500 Angstroms, using Low Pressure CVD. This is followed by the deposition of silicon oxide layer 22 to a thickness between about 500 and 1,000 Angstroms also using LPCVD.

A photoresist mask (not shown) is then applied to the surface and suitably patterned, following which the unprotected areas are anisotropically etched (vertical etching only by means of reactive ion etching) to form trench 23 which has the shape of a hollow square that is located inside the P-well region. Typically, the interior width of trench 23 would measure between about 0.5 and 1.5 microns. The depth of the trench would typically equal the thickness of the epitaxial layer, causing it to extend through layers 14, 15, 21, and 22, and partially through the N+ buried layer 11.

A layer of silicon oxide is then thermally grown, to a thickness between about 150 and 350 Angstroms, on the trench's inside surface so that previously formed layer 15 extends over the entire surface. The structure at this stage is as shown in FIG. 2.

Figure 3:
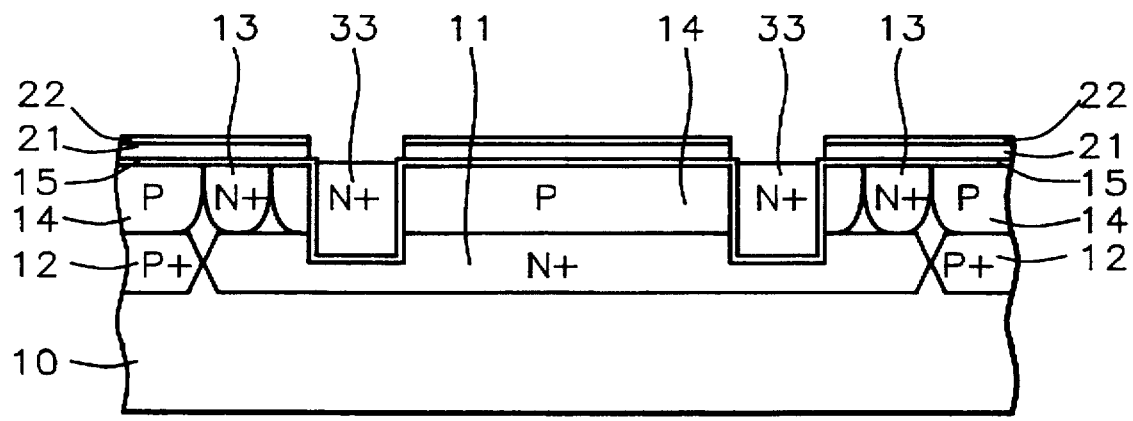

Referring now to FIG. 3, trench 23 is filled with N+ polysilicon 33 to form the gate electrode portion of the final device. Filling is accomplished by first over-filling with polysilicon and then etching back.

Figure 4A:
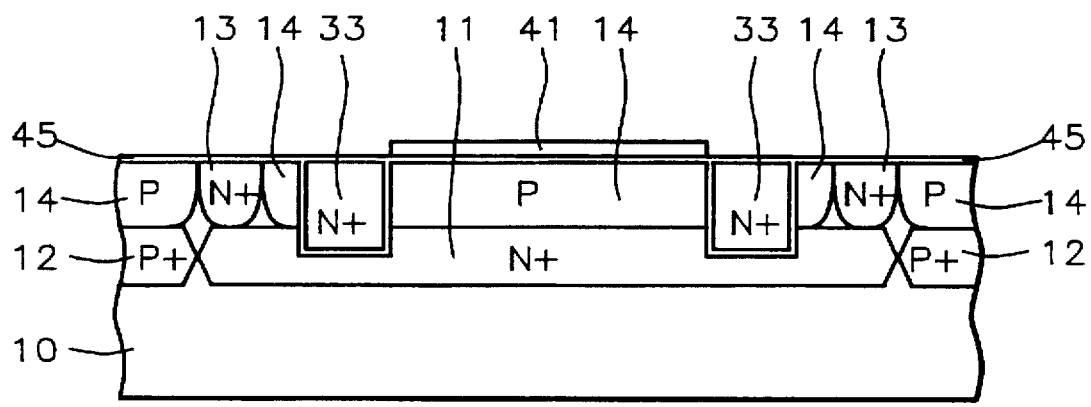
FIGS. 4A and 4B are cross-sections of the structure just prior to the formation of the field oxide regions.
Figure 4B:
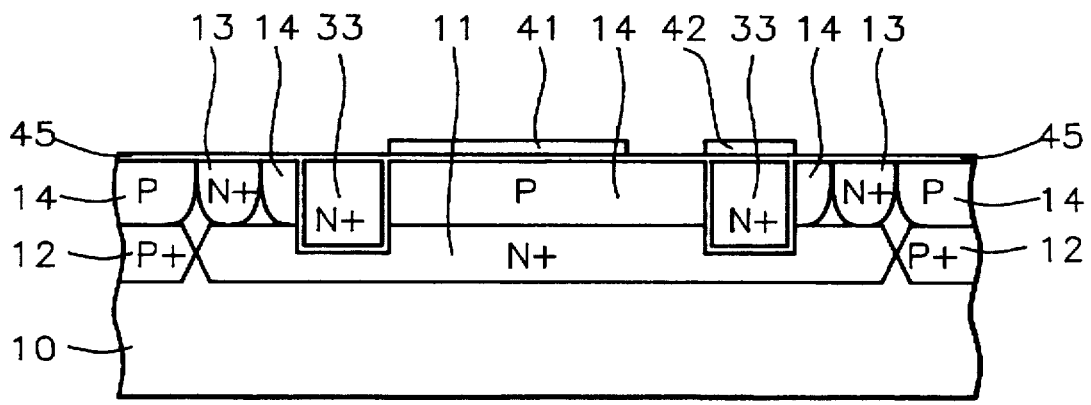

Referring now to FIGS. 4A and 4B, a layer of silicon oxide is grown on the exposed portions of N+ polysilicon 33. This layer is somewhat thicker than oxide layer 15, being between about 650 and 1,200 Angstroms thick, since, when oxide layer 22 is removed (in the next step), it is also attacked. By using the thicknesses stated, the net result is an oxide layer of uniform thickness (now designated as 45) that covers the entire surface. This is followed by the removal of silicon nitride masking layer 21.

Figure 4C:
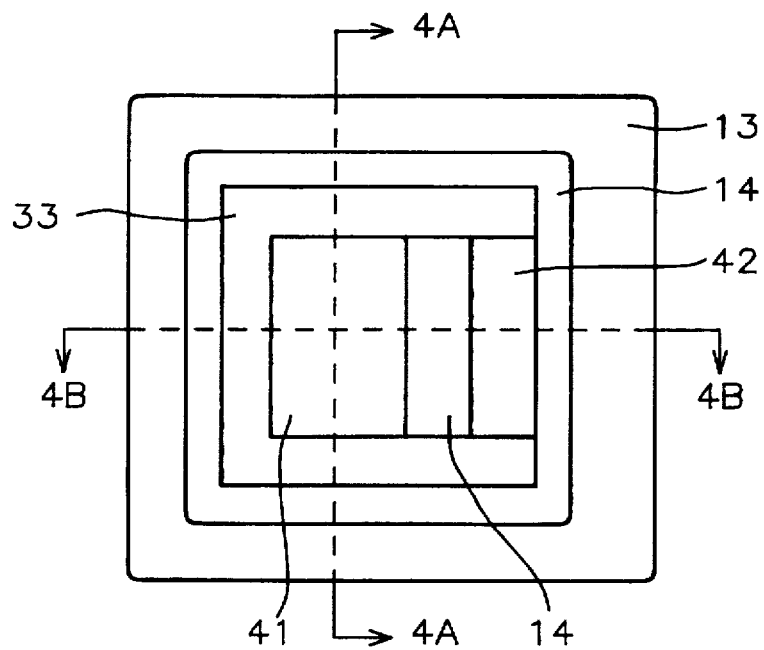
FIG. 4C is a plan view of which 4A and 4B are the cross-sections.

A fresh layer of silicon nitride, between about 750 and 1,500 Angstroms thick, is now deposited over the entire surface and then patterned and etched so that approximately half of the interior surface of gate electrode 33 and one of its sides are covered. This is most clearly seen in FIG. 4C where the silicon nitride on the inside of gate electrode 33 has been designated 41 while the silicon nitride covering the right side of the hollow square has been designated 42. FIGS. 4A and 4B are cross-sections of 4C taken as shown.

Figure 5A:
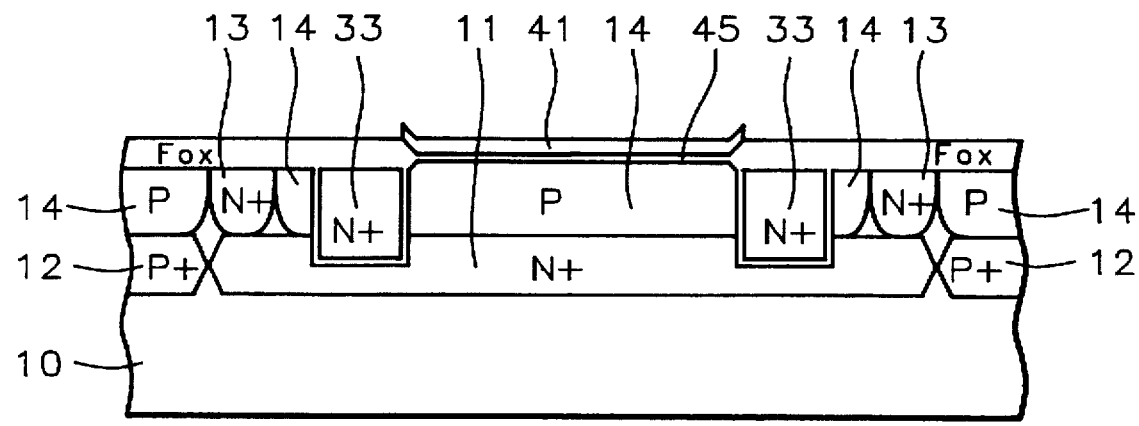
FIGS. 5A and 5B are cross-sections made after formation of the field oxide.
Figure 5B:
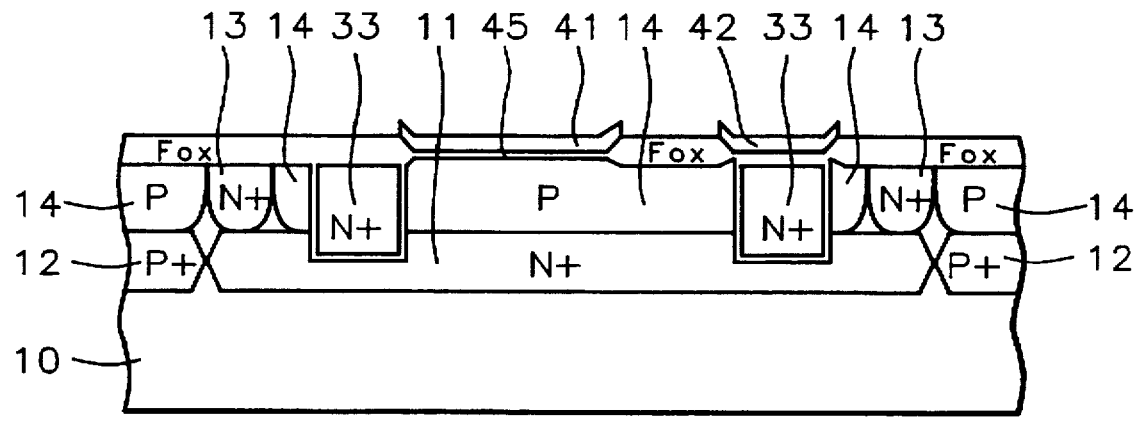

A standard oxidation procedure (wet oxidation at about 900° C.) now follows which leads to a substantial increase in the thickness of existing silicon oxide layer 45 wherever it is not covered by the silicon nitride, thus leading to the formation of the field oxide (FOX) regions shown in FIGS. 5A and 5B (corresponding to FIGS. 4A and 4B respectively). The FOX has a thickness between about 4,500 and 6,000 Angstroms.

Figure 6:
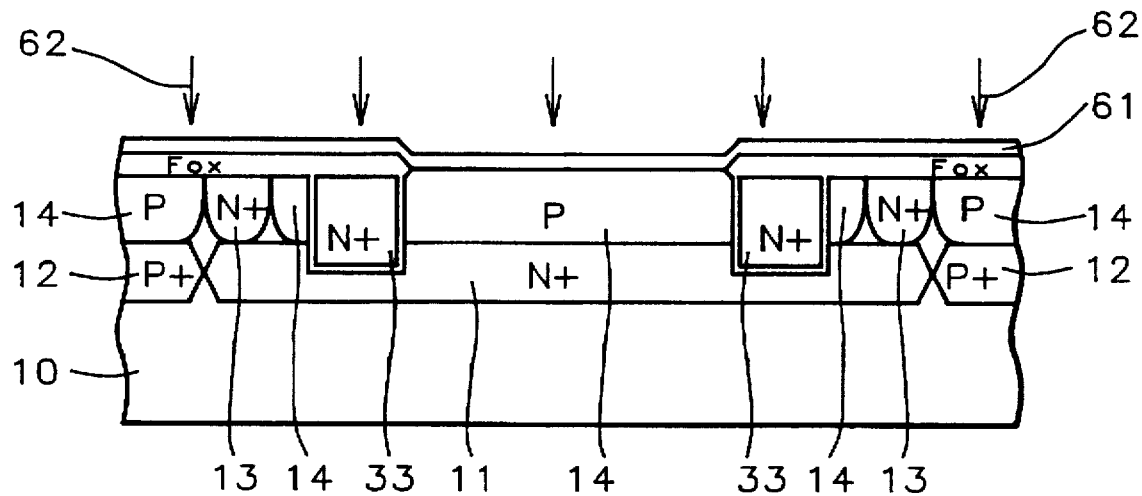

Referring now to FIG. 6, which represents a cross-section similar to 5A, the silicon nitride masking layers 41 and 42, as well as the (non FOX) silicon oxide immediately beneath it, is removed. This exposes the upper surface of the main silicon body everywhere that it is not covered by FOX. A layer of undoped polysilicon 61 is then laid down by CVD at about 600° C. to a thickness between about 2,000 and 2,500 Angstroms. This is followed by the implantation of arsenic ions, shown symbolically as arrows 62.

The range of energies imparted to the arsenic ions is between about 70 and 80 kilovolts, while the dosage is between about $1 \times 10^{16}$ and $2 \times 10^{16}$ per $cm^2$. This transforms layer 61 to N-type polysilicon. Note that layer 61 is also now in contact with a portion of N+ polysilicon 33 in the original trench. This is not seen in FIG. 6 but would be evident in a cross-section corresponding to FIG. 5B.

Figure 7:
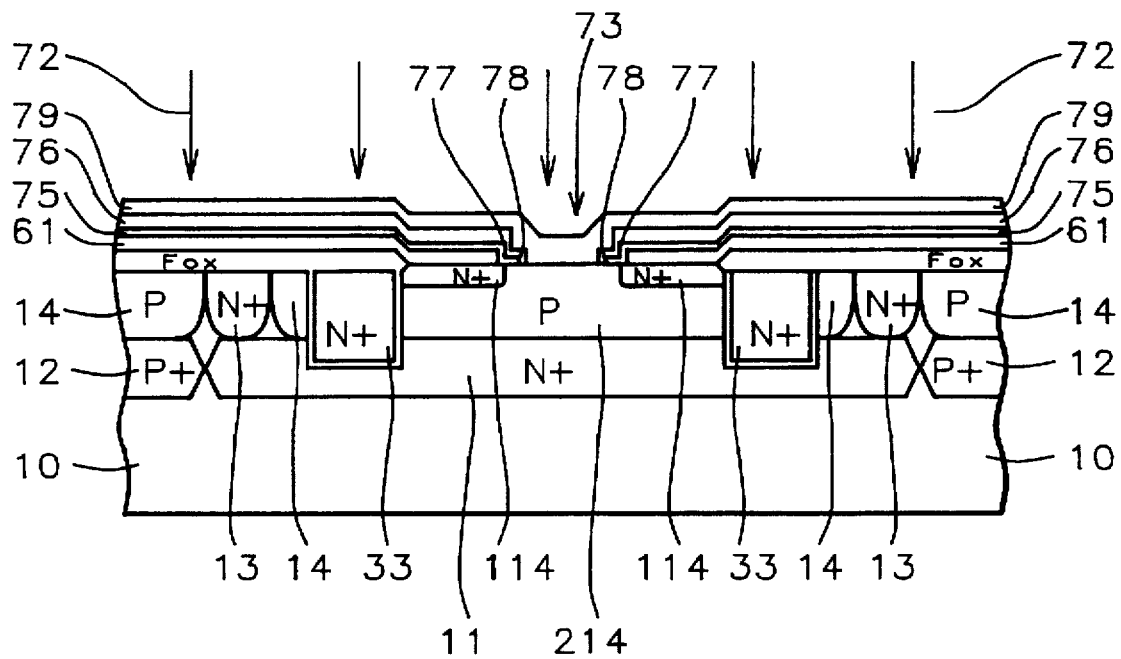

Moving now to FIG. 7, a base window opening 73 is selectively etched in layer 61. To open the base window 73, tetraethoxysilane (TEOS) layer 75 and silicon nitride layer 76 are initially deposited on layer 61 to thicknesses between about 800 and 1,200 Angstroms and between about 400 and 600 Angstroms, respectively. By means of reactive ion etching through layers 76, 75, and 61, the upper surface of the main body is exposed. At the same time, this etching step also defines the region of the polysilicon buffer layer in contact with N+ gate 33 (as can be seen in FIG. 8B).

A high temperature thermal oxidation step follows which results in thermal oxide 77 with a thickness between about 200 and 400 Angstroms, grown on the exposed surface and vertical sides of layer 61. Additionally, by this thermal oxidation procedure, the N-type dopants in layer 61 (implanted through 62) are driven into the silicon substrate, leading to the formation of layer 114 (N+ diffused layer having between about $2 \times 10^{20}$ and $6 \times 10^{20}$ donors/$cm^3$, which extends downwards to a depth between about 0.1 and 0.25 microns. Next, a layer of silicon nitride and a layer of polysilicon are deposited in sequence to thicknesses between about 800 and 1,000 and between about 1,600 and 1,800 Angstroms respectively. By using reactive ion etching to remove these top two layers, silicon nitride spacers 78 are left on the vertical sides of layer 61. However, between spacers 78 and the vertical sides of 61 there is indeed a sandwich layer 77. A fluoride acid dip follows to etch through layer 77 whereby base window 73 is exactly opened and self-aligned spacers are formed on the vertical sides of layer 61.

Polysilicon layer 79, between about 2,000 and 2,500 Angstroms thick, is then laid down over layers 61, 75, 76, 77, and 78. Boron ions, symbolically shown as arrows 72 are then implanted into 79 by using ion energies that range from about 50 to 65 kilovolts and dosages of from about $1 \times 10^{16}$ to $2 \times 10^{16}$ per sq. cm. This serves to return the region beneath 73 to being once more P type, the entire base region being now designated as 214.

Figure 8A:
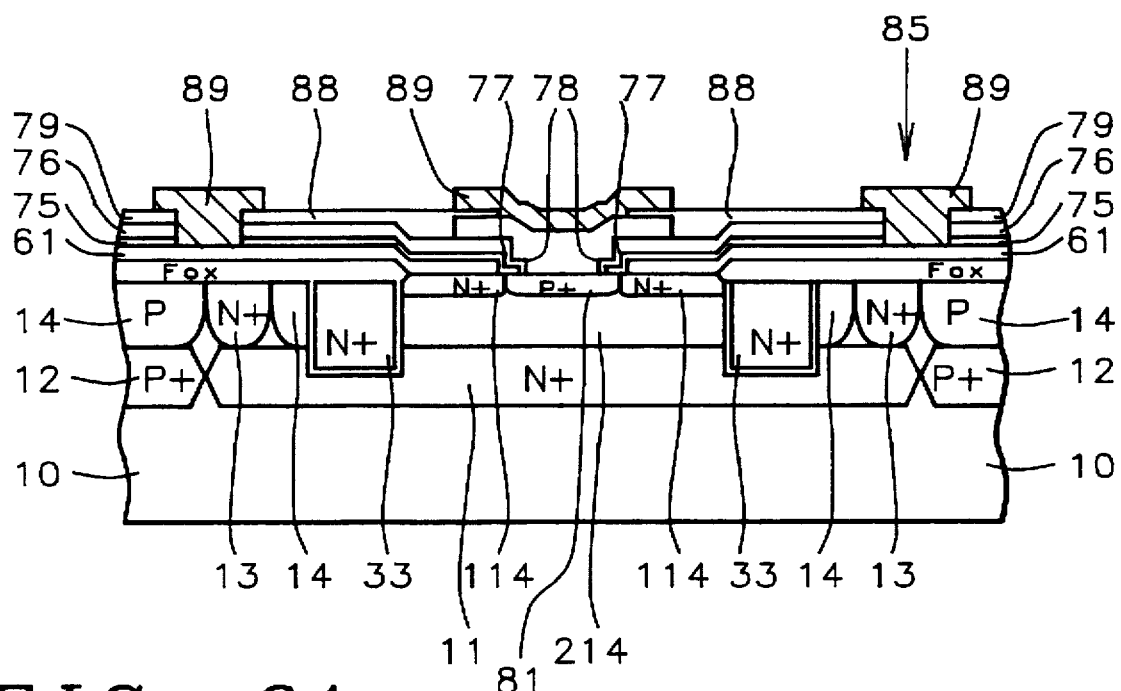
FIGS. 8A and 8B are cross-sections of the completed device, showing the surface wiring, including the location of the contact holes used by the wiring to access the device at the appropriate points.
Figure 8B:
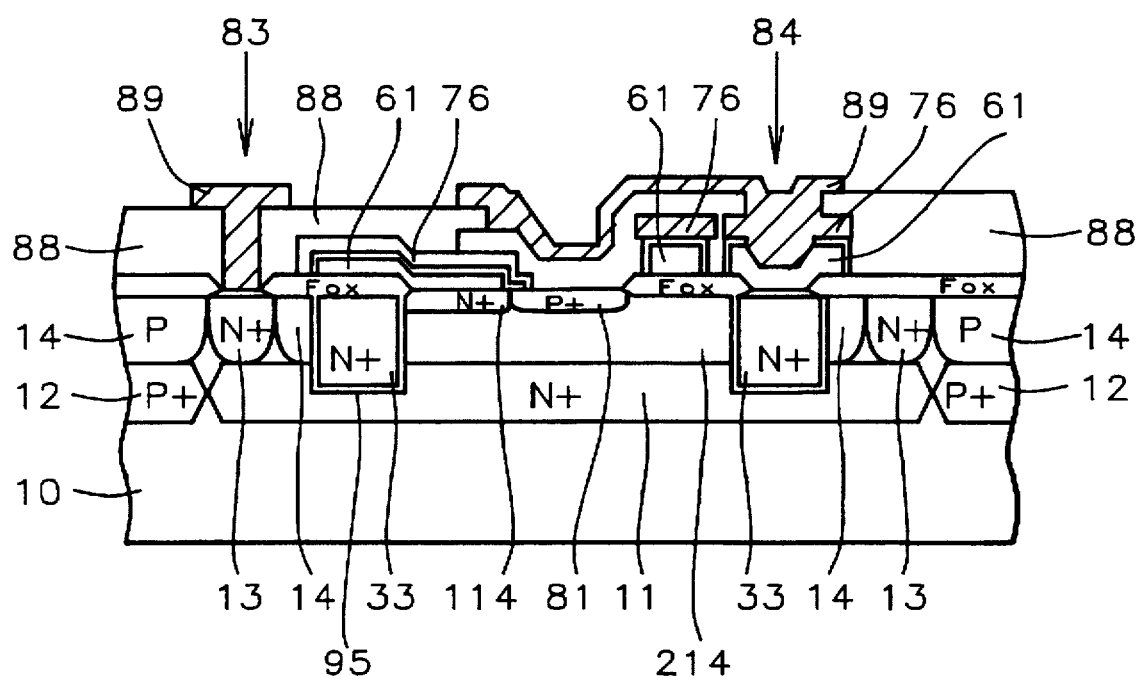

Referring now to FIGS. 8A and 8B, layer 79, the base poly layer, is now patterned and etched to define its connection to other parts of the circuit. A layer of low temperature oxide (LTO) 88, such as boro-phosphosilicate glass (BPSG), is now laid down over silicon oxide layer 75, to a thickness between about 8,000 and 10,000 Angstroms. This is followed by a heat treatment at about 900° to 950° C. for from 20 to 30 minutes which drives acceptor (boron) atoms into 214 at opening 73 to form P+ region 81 and causes the BPSG to flow, thereby improving both the degree of planarization and the electrical insulation. The method that was used to deposit the BPSG was plasma enhanced (PE) CVD at between about 250° and 350° C.

Next, the various necessary contact windows, 83 for the collector, 85 for the emitter, and 84 for the gate, are etched into LTO layer 88. Then metallic layer 89, comprising aluminum, or Al-Si or Al-Si-Cu is deposited by sputtering, or similar method such as vacuum evaporation, to a thickness between about 8,000 and 10,000 Angstroms. Layer 89 is then selectively etched to form the wiring that contacts the gate, base, emitter, and collector through the above mentioned contact windows. This ends the description of the process of our invention.

The device that is formed as a result of the above-described process is best seen by looking at FIG. 8B. A conventional bipolar device is defined by emitter 114, base region 214 and collector 11. The left hand edge of the device is bounded by insulating layer 95 which was originally part of layer 15 in FIG. 2. On the other side of 95 is N+ gate 33 (which makes contact at opening 84).

Figure 9:
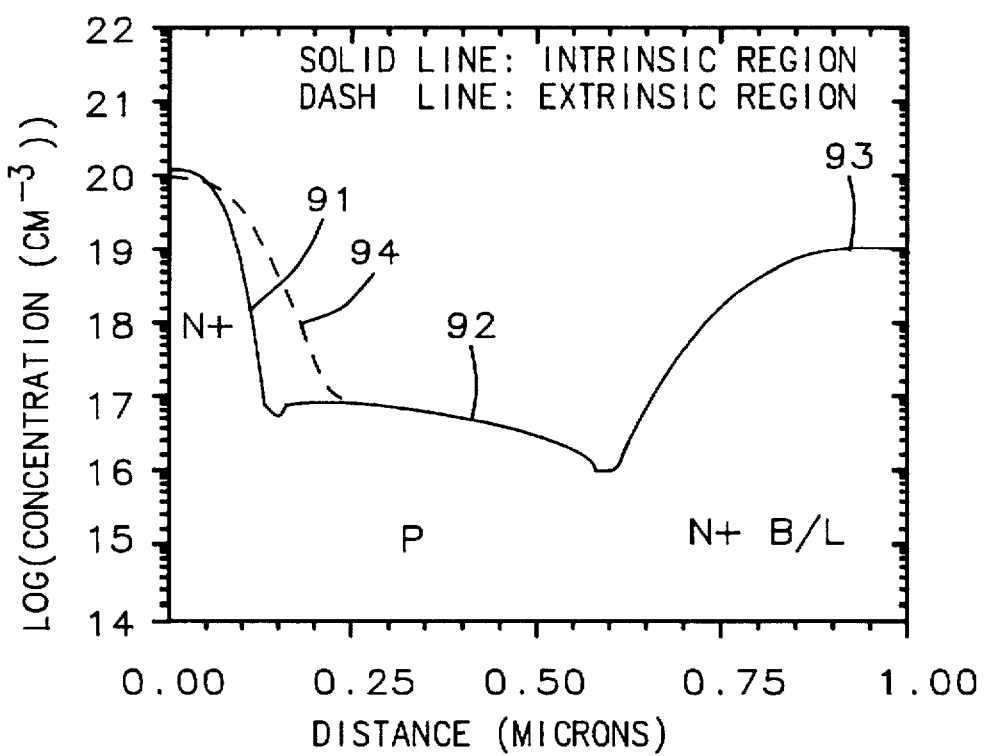
FIG. 9 is a doping concentration profile of the device, showing both the intrinsic and the extrinsic regions.

The doping concentration profile of the finished device is shown in FIG. 9. The 0.0 micron point corresponds to the top surface of emitter 114. The solid line represents the vertical doping profile of the intrinsic region. The junction depth of 114 is at about 0.15 microns where, as seen in curve 91, the donor concentration drops steeply. The intrinsic base region (curve 92) starts from about 0.15 microns to about 0.65 microns where the donor concentration rises once more (curve 93) to define the collector region. The dashed line in FIG. 9 shows the vertical profile of the extrinsic base 81. The extrinsic base region (curve 94) extends to a depth of about 0.25 microns. Since there is a work function difference between the polysilicon gate 33 and the base region 14, the energy band of base region 214, at the edge of 95, is somewhat bent. This causes the drop in electron barrier height of the emitter-base junction near the edge of 95 and therefore the emitter injection current is enhanced.

Figure 10:
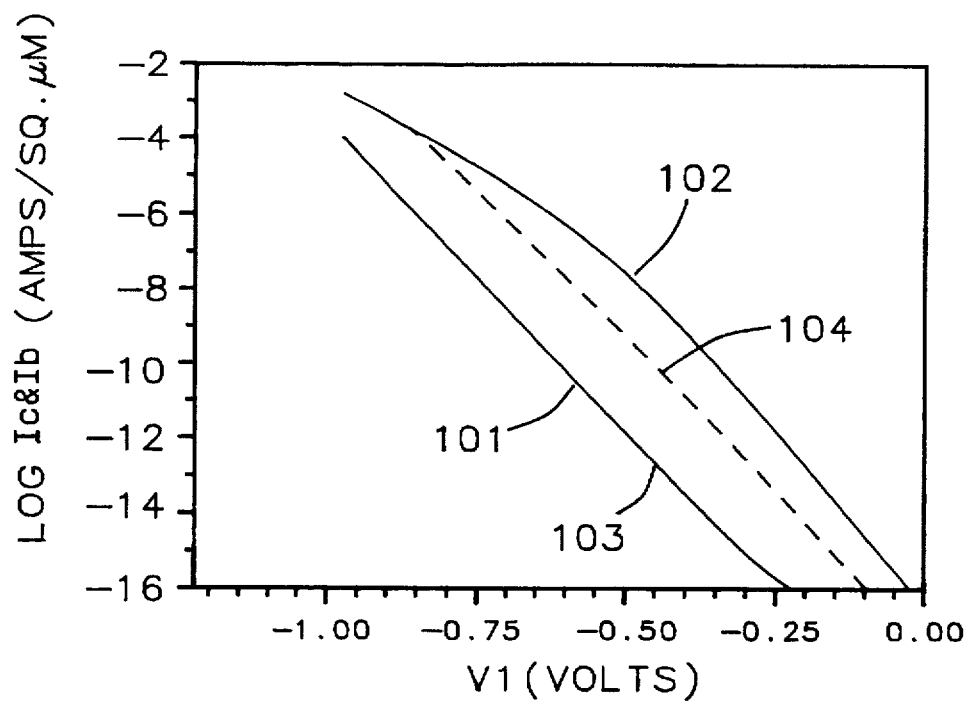
FIG. 10 is a simulated current-voltage plot for both base and collector, in the current device and in a device without edge enhancement.

In FIG. 10 we plot $\log_{10}$ of current density (in amps/sq. micron). Curves 101 and 102 are the base current density and the collector current density, respectively, of the present invention. Also drawn in FIG. 10 are the base current density and the collector current density of a conventional (no edge gate) device, as seen in dotted curves 103 and 104, respectively. As mentioned above, the edge gate could enhance the magnitude of the collector current so that curve 102 is greater than curve 104. However, the edge gate does not influence the base current level since the base current is dominated by hole injection in the bulk region rather than the edge region of 95. This makes the components of the base current to be almost the same so that curves 103 and 101 meet together.

Figure 11:
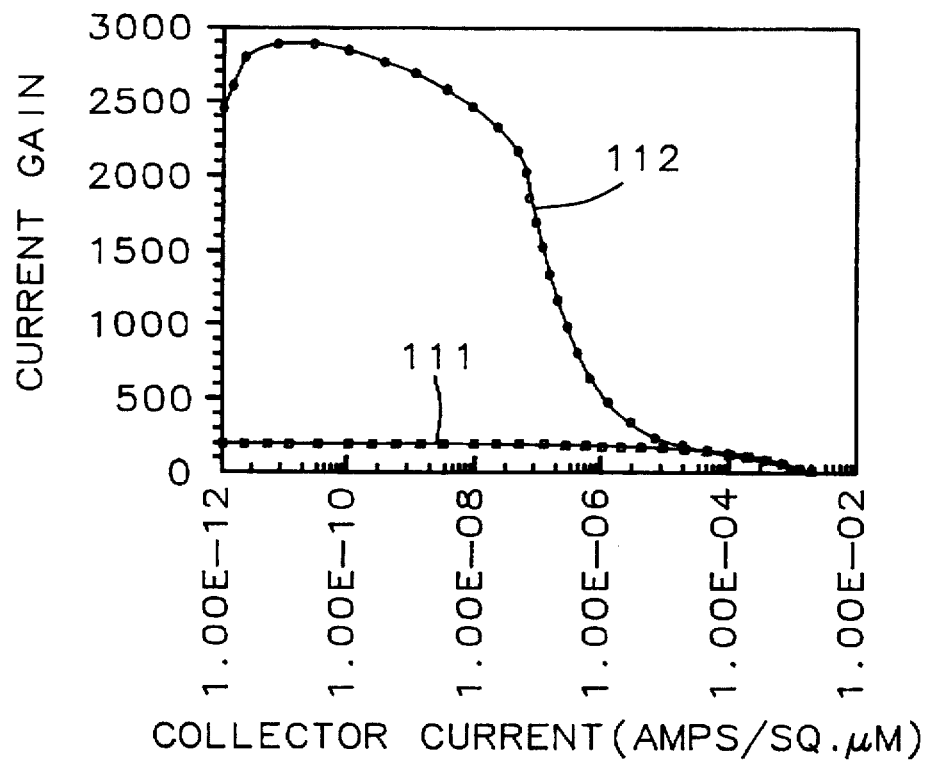
FIG. 11 is a plot of current gain vs. collector current for both the present device and a conventional one.

FIG. 11 is a plot of current gain as a function of collector current density in a $\log_{10}$ plot of amps/square micron. Curve 111 shows that a simulated current gain of about 200 is obtained from a transistor without an edge gate (conventional transistor). In contrast, from a transistor with the edge gate shorted to the base (the present invention), as shown in curve 112, the current gain rose to a value of about 2,500 at a collector current density of about $10^{-12}$ amps/sq. micron peaking at almost 3,000 and then eventually converging with the conventional value at a collector current density of about $10^{-4}$ amps/sq. micron.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a gate-enhanced bipolar transistor, comprising the sequential steps of:

providing a silicon body having an upper surface;

by means of ion implantation, forming N+ and P+ buried layer regions, located a distance below said upper surface;

depositing a layer of epitaxial silicon on said upper surface;

by means of ion implantation followed by thermal drive-in, forming N-type collector sink and P-well regions that extend from said upper surface to said buried layer regions;

growing a first layer of silicon oxide on said upper surface;

depositing a first layer of silicon nitride on the first layer of silicon oxide;

depositing a second layer of silicon oxide on said first layer of silicon nitride;

anisotropically etching a trench, having the shape of a hollow square, located within said P-well region and having an inside surface, to a depth such that the trench extends through the second layer of silicon oxide, the first layer of silicon nitride, the first layer of silicon oxide, and the P-well region, and partially through the N+ buried layer;

growing a third layer of silicon oxide on the trench's inside surface;

filling the trench with N+ polysilicon, thereby forming a gate electrode;

growing a fourth layer of silicon oxide on the N+ polysilicon, said fourth oxide layer being thicker than said second oxide layer;

removing the second layer of silicon oxide and the first layer of silicon nitride, thereby exposing the first layer of silicon oxide;

depositing a second layer of silicon nitride on the first and fourth layers of silicon oxide;

selectively etching the second layer of silicon nitride;

increasing the thickness of said first and fourth layers of silicon oxide, wherever they are not covered by silicon nitride, thereby forming regions of field oxide;

removing said second layer of silicon nitride and the oxide layer that is immediately beneath it, thereby exposing said upper surface wherever it is not covered by field oxide;

depositing a first layer of undoped polysilicon;

implanting arsenic ions, said ions having a range of energies such that the layer of undoped polysilicon is transformed into a layer of N-type polysilicon;

depositing a fifth silicon oxide layer on said layer of N-type polysilicon;

depositing a third layer of silicon nitride on said fifth silicon oxide layer;

patterning and etching the fifth silicon oxide layer and the third silicon nitride layer in an area located inside the hollow square, thereby forming a base window opening mask;

growing a sixth silicon oxide layer on both sides of the N-type polysilicon layer and the exposed upper surface;

depositing a fourth layer of silicon nitride;

depositing a second polysilicon layer;

anisotropically etching said layers of polysilicon and silicon nitride until the sixth silicon oxide layer is exposed, thereby forming self-aligned spacers;

lightly etching exposed portions of the sixth silicon oxide layer, thereby forming a fully opened base window;

depositing a third layer of polysilicon;

implanting boron ions, said ions having a range of energies such that said third layer of polysilicon is converted to P type;

patterning and etching the third layer of polysilicon so as to define circuit connections and then heating it so that boron ions are driven into the silicon at the base window opening, thereby forming a P+ base contact;

depositing a layer of low temperature oxide over all exposed surfaces;

heating the silicon body to a sufficient extent as to cause the low temperature oxide layer to flow, thereby providing for improved planarity;

etching contact holes through said layer of low temperature oxide, said fourth layer of silicon nitride, and said fifth layer of silicon oxide; and depositing and then selectively etching a metal layer to form wiring that contacts the gate, the base window opening, the emitter, and the N-type collector sink.

2. The process described in claim 1 wherein said N+ and P+ buried layers are located between about 0.8 and 2 microns below said upper surface.

3. The process described in claim 1 wherein said first layer of silicon oxide is grown to a thickness between about 150 and 350 Angstroms.

4. The process described in claim 1 wherein said first layer of silicon nitride is grown to a thickness between about 750 and 1,500 Angstroms.

5. The process described in claim 1 wherein said second layer of silicon oxide is deposited to a thickness between about 500 and 1,000 Angstroms.

6. The process described in claim 1 wherein said trench has an inside width between about 0.5 and 1.5 microns.

7. The process described in claim 1 wherein said third layer of silicon oxide is grown to a thickness between about 150 and 350 Angstroms.

8. The process described in claim 1 wherein said fourth layer of silicon oxide is grown to a thickness between about 650 and 1,200 Angstroms.

9. The process described in claim 1 wherein said second layer of silicon nitride is deposited to a thickness between about 750 and 1,500 Angstroms.

10. The process described in claim 1 wherein the regions of field oxide are grown to a thickness between about 4,500 and 6,000 Angstroms.

11. The process described in claim 1 wherein said first layer of undoped polysilicon is deposited to a thickness between about 2,000 and 2,500 microns.

12. The process described in claim 1 wherein said arsenic ions have a range of energies between about 70 and 80 kilovolts and dosages between about $1\times10^{16}$ and $2\times10^{16}$ per sq. cm.

13. The process described in claim 1 wherein said fifth silicon oxide layer is deposited to a thickness between about 800 and 1,200 Angstroms.

14. The process described in claim 1 wherein said third layer of silicon nitride is deposited to a thickness between about 400 and 600 Angstroms.

15. The process described in claim 1 wherein said sixth layer of silicon oxide is grown to a thickness between about 200 and 400 Angstroms.

16. The process described in claim 1 wherein said fourth layer of silicon nitride is deposited to a thickness between about 800 and 1,000 Angstroms.

17. The process described in claim 1 wherein said second polysilicon layer is deposited to a thickness between about 1,600 and 1,800 Angstroms.

18. The process described in claim 1 wherein said third polysilicon layer is deposited to a thickness between about 2,000 and 2,500 Angstroms.

19. The process described in claim 1 wherein said boron ions have a range of energies between about 50 and 65 kilovolts and dosages between about $1\times10^{16}$ and $2\times10^{16}$ per sq. cm.

20. The process described in claim 1 wherein said metal layer is selected from the group consisting of aluminum, aluminum-silicon, and aluminum-silicon-copper.

21. The process described in claim 1 wherein the step of depositing a layer of low temperature oxide further comprises depositing TEOS and BPSG by low temperature CVD.

* * * * *